United States Patent
Lin et al.

(10) Patent No.: US 12,463,610 B2
(45) Date of Patent: Nov. 4, 2025

(54) ANALOG FRONT-END DEVICE

(71) Applicant: REALTEK SEMICONDUCTOR CORPORATION, Hsinchu (TW)

(72) Inventors: Jian-Ru Lin, Hsinchu (TW); Kai-Yue Lin, Hsinchu (TW); Yu-Ting Chiu, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 776 days.

(21) Appl. No.: 17/830,382

(22) Filed: Jun. 2, 2022

(65) Prior Publication Data
US 2023/0025101 A1    Jan. 26, 2023

(30) Foreign Application Priority Data
Jul. 14, 2021 (TW) ................. 110125950

(51) Int. Cl.
*H03G 3/30* (2006.01)
*H03F 1/02* (2006.01)
*H03F 3/19* (2006.01)

(52) U.S. Cl.
CPC ......... *H03G 3/3036* (2013.01); *H03F 1/0233* (2013.01); *H03F 3/19* (2013.01); *H03F 2200/105* (2013.01); *H03G 2201/103* (2013.01)

(58) Field of Classification Search
CPC ............ H03G 3/3036; H03G 2201/103; H03F 1/0233; H03F 3/19; H03F 2200/105
USPC ........................................... 330/278
See application file for complete search history.

(56) References Cited

U.S. PATENT DOCUMENTS

| | | | |
|---|---|---|---|
| 8,710,925 B2 * | 4/2014 | Drogi | H03F 3/189 330/297 |
| 2015/0222238 A1 | 8/2015 | Lee | |
| 2017/0194911 A1 * | 7/2017 | Aksin | H03F 3/45103 |

FOREIGN PATENT DOCUMENTS

CN    113542635 A    * 10/2021

OTHER PUBLICATIONS

Holdenried et al., "A DC-4-GHz True Logarithmic Amplifier: Theory and Implementation", IEEE Journal of Solid-State Circuits, vol. 37, No. IO, Oct. 2002 (Year: 2002).*

(Continued)

*Primary Examiner* — Hafizur Rahman
(74) *Attorney, Agent, or Firm* — WPAT, PC

(57) ABSTRACT

An analog front-end device includes an amplifier circuit, a first gain control circuit, and a tracking circuit. The amplifier circuit is configured to generate a first output signal according to a first input signal. The first gain control circuit is configured to set a first electronic component according to a first gain control signal and transmit the first input signal to a first input terminal of the amplifier circuit via the first electronic component, in which a terminal of the first electronic component is selectively coupled to the first input terminal or a first predetermined node. The tracking circuit is configured to adjust a level of the first predetermined node according to a level of the first input terminal, in order to reduce a voltage difference between the first input terminal and the first predetermined node.

20 Claims, 7 Drawing Sheets

(56) References Cited

OTHER PUBLICATIONS

OA letter of a counterpart TW application (appl. No. 110125950) mailed on Dec. 17, 2021. Summary of the TW OA letter: 1. Claims 1-2, 5 and 10 are rejected as allegedly being anticipated by cited reference 1 (US 20150222238A1). 2. Claims 3-4 and 6-9 are allowable. Correspondence between claims of TW counterpart application and claims of US application: 1. Claims 1-6, 7, 8, 9, and 10 in TW counterpart application correspond to claims 1-6, 9, 11, 12, and 16 in US application, respectively.

* cited by examiner

ANALOG FRONT-END DEVICE

BACKGROUND OF THE INVENTION

1. Field of the Invention

The present disclosure relates to an analog front-end device. More particularly, the present disclosure relates to an analog front-end device able to reduce impacts from transient error(s).

2. Description of Related Art

In an analog front-end system in a communication application, a programmable gain amplifier circuit is commonly utilized to amplify a signal for subsequent processing. In current approaches, when the system determines a specific gain required by the ongoing input signal, the gain of the programmable gain amplifier circuit is kept being the specific gain and may not be further adjusted. However, during receiving the signals, the signal-to-noise ratio of the analog front-end system may be degraded due to impacts from temperature or other non-ideal factors. If the gain of the programmable gain amplifier circuit is adjusted to reduce the impacts from temperature or other non-ideal factors during receiving signals, the analog front-end system may be affected by transient response(s) during the gain adjustment, which results in a low the signal-to-noise ratio of the analog front-end system and/or incorrect output data.

SUMMARY

In some aspects, an analog front-end device includes an amplifier circuit, a first gain control circuit, and a tracking circuit. The amplifier circuit is configured to generate a first output signal according to a first input signal. The first gain control circuit is configured to set a first electronic component according to a first gain control signal and transmit the first input signal to a first input terminal of the amplifier circuit via the first electronic component, in which a terminal of the first electronic component is selectively coupled to the first input terminal or a first predetermined node. The tracking circuit is configured to adjust a level of the first predetermined node according to a level of the first input terminal, in order to reduce a voltage difference between the first input terminal and the first predetermined node.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with at least one circuit, and the term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1A:
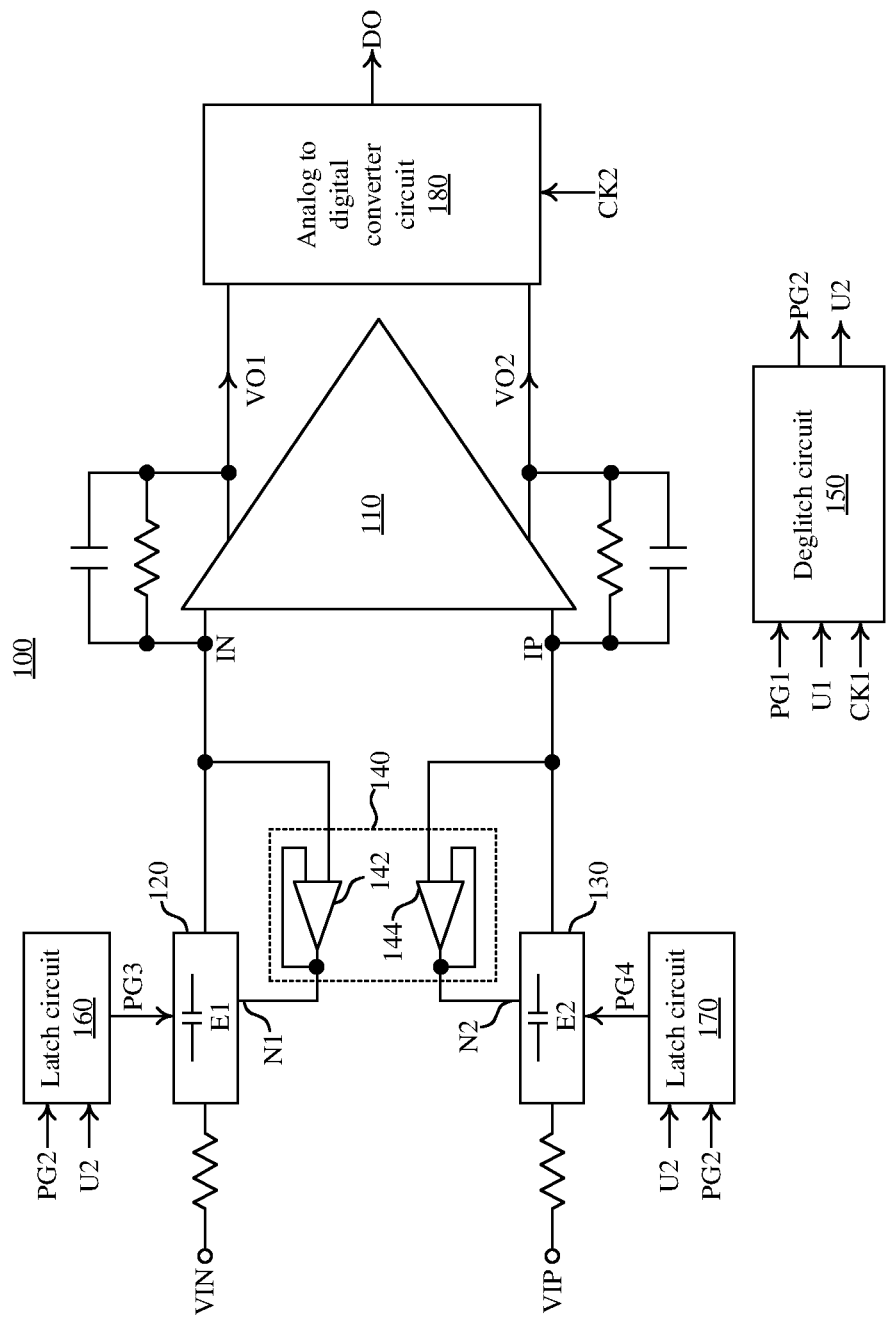
FIG. 1A shows a schematic diagram of an analog front-end device according to some embodiments of the present disclosure.

FIG. 1A shows a schematic diagram of an analog front-end device 100 according to some embodiments of the present disclosure. In some embodiments, the analog front-end device 100 may be applied to a communication system, in order to perform an initial processing (e.g., amplification, filtering, analog to digital conversion, and so on) on the received signal(s) (e.g., an input signal VIN and an input signal VIP) for subsequent circuits.

In some embodiments, the analog front-end device 100 includes an amplifier circuit 110, a gain control circuit 120, a gain control circuit 130, a tracking circuit 140, a deglitch circuit 150, a latch circuit 160, a latch circuit 170, and an analog to digital converter circuit 180.

The gain control circuit 120 and the gain control circuit 130 are configured to set a gain of the analog front-end device 100 according to a gain control signal PG1. In some embodiments, the gain control circuit 120 may set an electronic component E1 (which may be, but not limited to, a capacitive component, a resistive component, and so on) in response to the gain control signal PG1, and transmit an input signal VIN to a first input terminal of the amplifier circuit 110 (hereinafter referred to as "terminal IN" for simplicity) via the electronic component E1. For example, the gain control circuit 120 may adjust a circuit configuration of the gain control circuit 120 according to a gain control signal PG3 to adjust the electronic component E1, in which the gain control signal PG3 is generated based on the gain control signal PG1. Similarly, in some embodiments, the gain control circuit 130 may set an electronic component E2 (which may be, but not limited to, a capacitive component, a resistive component, and so on) in response to the gain control signal PG1, and transmit an input signal VIP to a second input terminal of the amplifier circuit 110 (hereinafter referred to as "terminal IP" for simplicity) via the electronic component E2. For example, the gain control circuit 130 may adjust a circuit configuration of the gain control circuit 130 according to a gain control signal PG4 to adjust the electronic component E2, in which the gain control signal PG4 is generated based on the gain control signal PG1. The amplifier circuit 110 may be a differential amplifier circuit (i.e., the terminal IN and the terminal IP are differential input terminals), which is configured to generate an output signal VO1 and an output signal VO2 according to the input signal VIN and the input signal VIP.

As shown in FIG. 1A, a terminal of the electronic component E1 is selectively coupled to the terminal IN or the predetermined node N1, and a terminal of the electronic component E2 is selectively coupled to the terminal IP or the predetermined node N2. In some embodiments, the tracking circuit 140 is configured to adjust a level of the predetermined node N1 according to a level of the terminal IN, and adjust a level of the predetermined node N2 according to a level of the terminal IP. For example, the tracking circuit 140 includes a unity-gain buffer circuit 142 and a unity-gain buffer circuit 144. The unity-gain buffer circuit 142 is configured to set the level of the predetermined node N1 according to the level of the terminal IN. The unity-gain buffer circuit 144 is configured to set the level of the predetermined node N2 according to the level of the terminal IP. With the tracking circuit 140, a voltage difference between the terminal IN and the predetermined node N1 is reduced, and a voltage difference between the terminal IP and the predetermined node N2 is reduced. As a result, redistribution of charges on the electronic component E1 and the electronic component E2 can be avoided during the gain adjustment, in order to lower transient error(s) on the output signal VO1 and the output signal VO2.

Figure 3A:
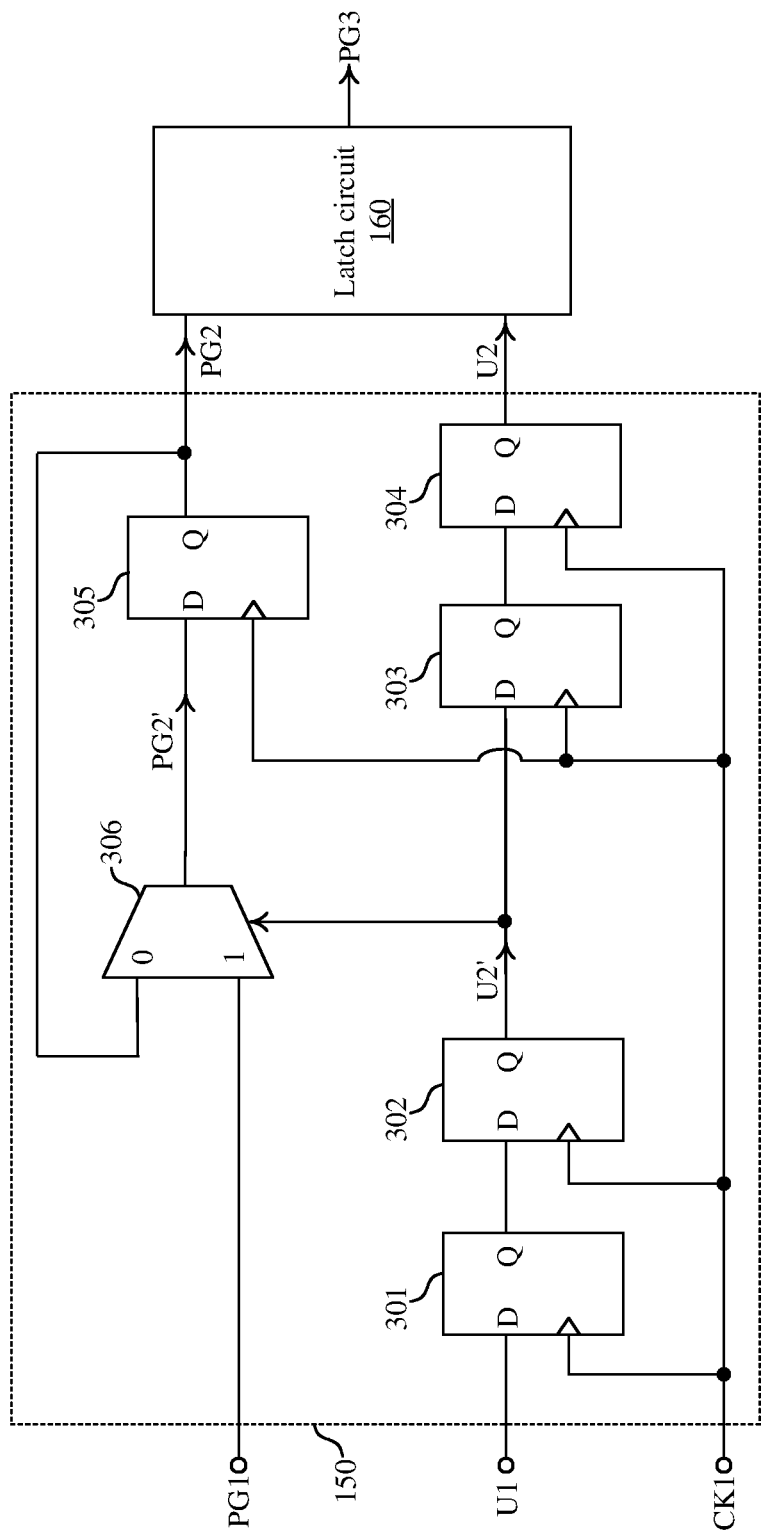
FIG. 3A shows a schematic diagram of the deglitch circuit in FIG. 1A or FIG. 1B according to some embodiments of the present disclosure.

The deglitch circuit 150 is configured to remove glitches on an update signal U1 according to the clock signal CK1, in order to generate an update signal U2 (as shown in FIG. 3A), and is configured to generate the gain control signal PG2 according to the update signal U1 and the gain control signal PG1, and output the gain control signal PG2 and the update signal U2 to the latch circuit 160 and the latch circuit 170 according to the clock signal CK1. As a result, impacts from glitches on the gain adjustment of the analog front-end device 100 can be lower. Relevant arrangements about the deglitch circuit 150 will be given with reference to FIG. 3A.

The latch circuit 160 may output the gain control signal PG2 to be the gain control signal PG3 according to the update signal U2. As a result, the gain control circuit 120 may adjust the electronic component E1 in response to the gain control signal PG3, in order to adjust the gain of the analog front-end device 100. Similarly, the latch circuit 170 may output the gain control signal PG2 to be the gain control signal PG4 according to the update signal U2. As a result, the gain control circuit 130 may adjust the electronic component E2 in response to the gain control signal PG4, in order to adjust the gain of the analog front-end device 100. With the latch circuit 160 and the latch circuit 170, it can be assured that the gain control circuit 120 and the gain control circuit 130 adjust the electronic component E1 and the electronic component E2 after the switching of all bits in the gain control signal PG1 is completed. As a result, a timing difference between switching of components in the gain control circuit 120 and the gain control circuit 130 can be reduced, in order to reduce the transient error(s) of the output signal VO1 and the output signal VO2. Relevant arrangements about the latch circuit 160 and the latch circuit 170 will be provided with reference to FIG. 4A and FIG. 4B.

The analog to digital converter circuit 180 samples the output signal VO1 and the output signal VO2 according to the clock signal CK2, in order to generate the digital output DO. In some embodiments, a phase difference between the clock signal CK1 and the clock signal CK2 is set according to transient error(s) of the output signal VO1 (and/or the output signal VO2). As a result, the analog to digital converter circuit 180 is prevented from sampling the inaccurate output signals VO1 and VO2, in order to provide the effective digital output DO. Relevant arrangements regarding herein will be provided with reference to FIG. 3B.

Figure 1B:
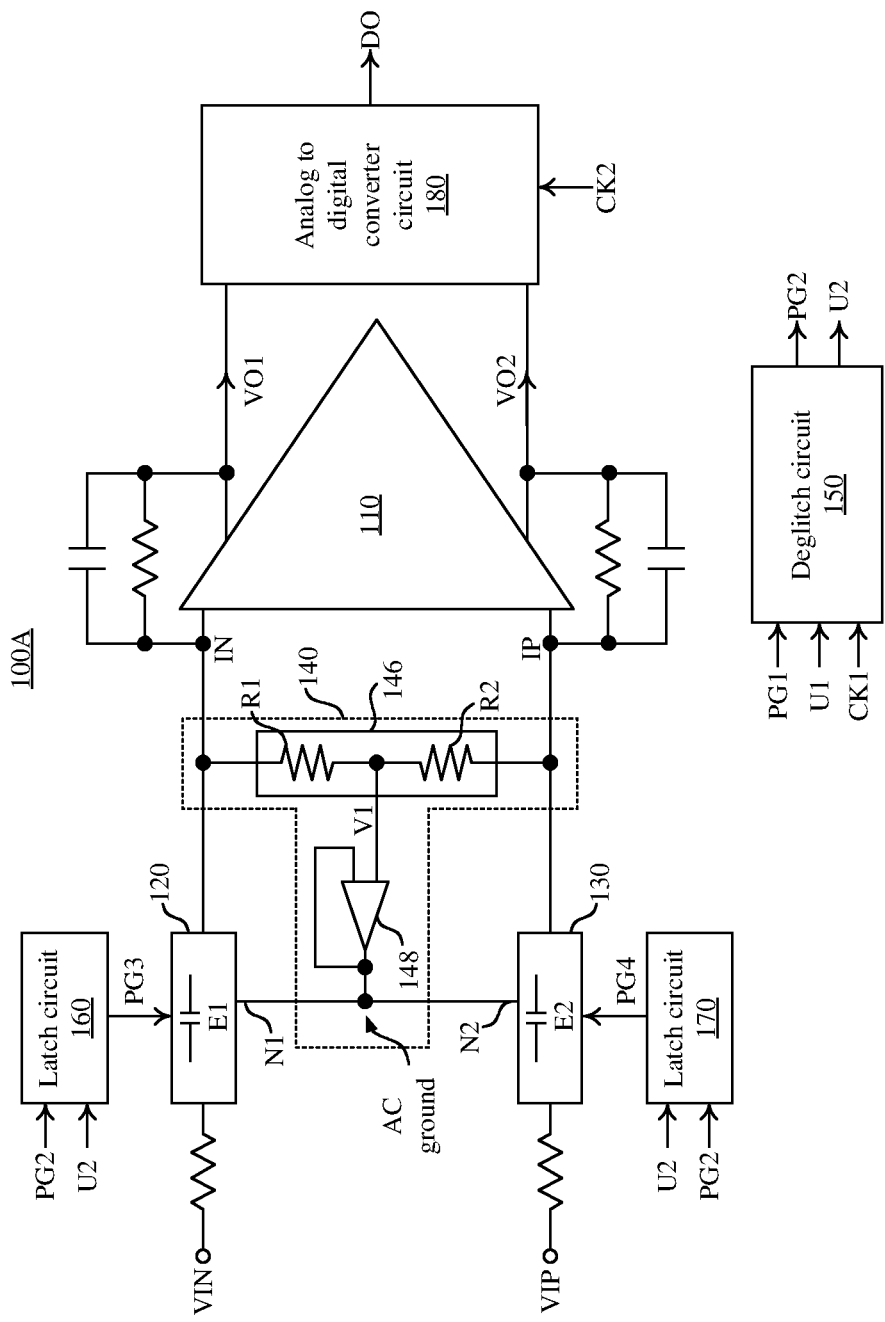
FIG. 1B shows a schematic diagram of an analog front-end device according to some embodiments of the present disclosure.

FIG. 1B shows a schematic diagram of an analog front-end device 100A according to some embodiments of the present disclosure. Compared with the analog front-end device 100 in FIG. 1A, in this example, the predetermined node N1 and the predetermined node N2 are coupled to each other (e.g., all coupled to AC ground), in order to have the same level. The tracking circuit 140 is configured to adjust the level of and that of the predetermined node N1 and that of the predetermined node N2 according to the level of the terminal IN and that of the terminal IP. For example, the tracking circuit 140 includes a sensing circuit 146 and a unity-gain buffer circuit 148. The sensing circuit 146 is configured to generate a voltage V1 according to the level of the terminal IN and that of the terminal IP. In some embodiments, the sensing circuit 146 may include a resistor R1 and a resistor R2. A first terminal of the resistor R1 is coupled to the terminal IN, and a second terminal of the resistor R1 is coupled to a first terminal of the resistor R2 and is configured to generate the voltage V1. A second terminal of the resistor R2 is coupled to the terminal IP. The unity-gain buffer circuit 148 is configured to set the level of the predetermined node N1 and that of the predetermined node N2 according to the voltage V1.

The arrangements of the tracking circuit 140 in FIG. 1A or FIG. 1B are given for illustrative purposes, and the present disclosure is not limited thereto. Various arrangements of the tracking circuit 140 able to reduce the voltage difference are within the contemplated scope of the present disclosure.

Figure 2A:
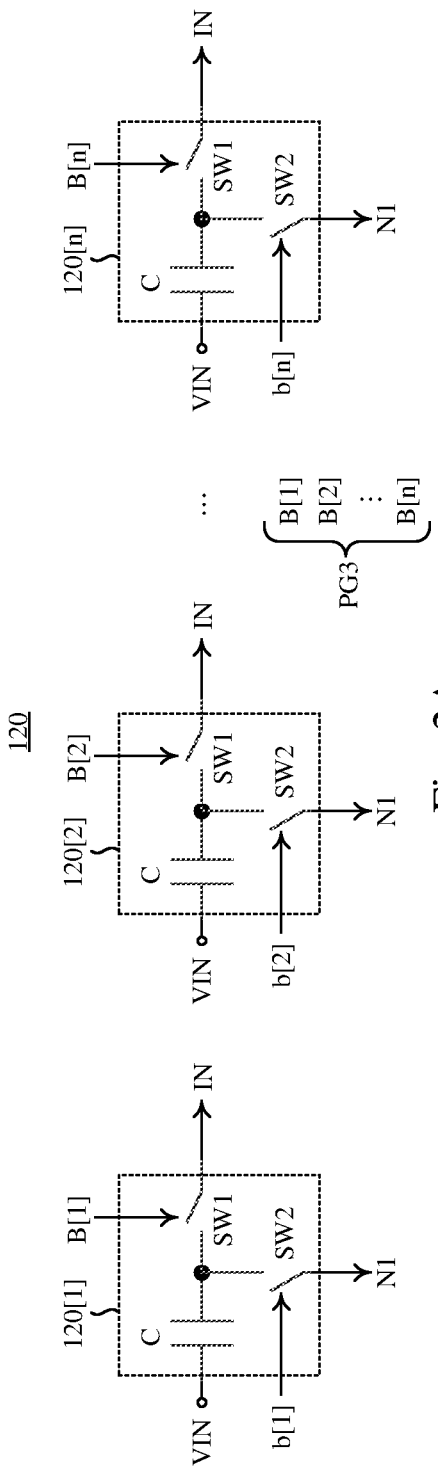
FIG. 2A shows a schematic diagram of the gain control circuit in FIG. 1A or FIG. 1B according to some embodiments of the present disclosure.

FIG. 2A shows a schematic diagram of the gain control circuit 120 in FIG. 1A or FIG. 1B according to some embodiments of the present disclosure. In some embodiments, the gain control circuit 120 may be an AC-coupling circuit, which may transmit an AC signal component in the input signal VIN to the terminal IN in FIG. 1A or FIG. 1B. In this example, the gain control circuit 120 includes switched-capacitor circuits 120[1]-120[n], in which n may be a positive integer higher than 1. The switched-capacitor circuits 120[1]-120[n] are switched according to bits B[1]-B[n] of the gain control signal PG3 (which may be considered as the delayed gain control signal PG1), in order to provide an equivalent capacitor as the electronic component E1.

Each of the switched-capacitor circuits 120[1]-120[n] includes a capacitor C, a switch SW1, and a switch SW2. The switches SW1 in the switched-capacitor circuits 120[1]-120[n] are respectively controlled by the bits B[1]-B[n], and the switches SW2 in the switched-capacitor circuits 120[1]-120[n] are respectively controlled by the bits b[1]-b[n]. Taking the switched-capacitor circuits 120[1] as an example, a first terminal of the capacitor C receives the input signal VIN, and a second terminal of the capacitor C is coupled to the switch SW1 and the switch SW2. The switch SW1 is selectively turned on according to the bit B[1], in order to couple the second terminal of the capacitor C (which may be considered as the electronic component E1) to the terminal IN. The switch SW2 is selectively turned on according to a bit b[1], in order to couple the second terminal of the capacitor C to the predetermined node N1. In some embodiments, the analog front-end device 100 (and/or the analog front-end device 100A) may include inverter circuits (not shown in the figures), which may generate the bits b[1]-b[n] (not shown completely) according to the bits B[1]-B[n]. A corresponding bit in the bits B[1]-B[n] (e.g., the bit B[n]) and a corresponding bit in the bits b[1]-b[n] (e.g., the bit b[n]) have the opposite logic values. For example, when the bit B[1] has a logic value of 1, the bit b[1] has a logic value of 0.

When the switch SW1 is turned on in response to the bit B[1], the switch SW2 is not turned on in response to the bit b[1]. Alternatively, when the switch SW2 is turned on in response to the bit b[1], the switch SW1 is not turned on in response to the bit B[1]. In other words, an interval of the switch SW1 being turned on is not overlapped with an interval of the switch SW2 being turned on, such that the second terminal of the capacitor C (i.e., the electronic component E1) is prevented from being connected to the terminal IN and the predetermined node N1 simultaneously. With the above arrangements, the voltage disturbance generated from the switching of the gain control circuit 120 can be reduced, in order to reduce re-distribution of charges between the capacitors C in switched-capacitor circuits 120[1]-120[n]. As a result, the transient error(s) of the output signal VO1 and the output signal VO2 can be reduced.

When the number of the capacitor C being coupled in parallel between the terminal IN and a node that receives the input signal VIN is higher, the capacitance value of the equivalent capacitor (i.e., the electronic component E1 formed with the capacitors C) is higher, such that the AC impedance of the electronic component E1 is lower. As a result, the power of the AC signal component in the input signal VIN that is transmitted from the gain control circuit 120 to the terminal IN are increased. With such adjustment, the gain of the analog front-end device 100 can be increased. Alternatively, when the number of the capacitors C being coupled in parallel between the terminal IN and the node that receives the input signal VIN is lower, the capacitance value of the equivalent capacitor (i.e., the electronic component E1 formed with the capacitors C) is lower, such that AC impedance of the electronic component E1 is higher. As a result, the power of the AC signal component in the input signal VIN being transmitted from the gain control circuit 120 to the terminal IN is reduced. With such adjustments, the gain of the analog front-end device 100 can be lower.

In some embodiments, a capacitance value of the capacitor C in at least one first circuit of the switched-capacitor circuits 120[1]-120[n] may be set according to transient error of the output signal VO1, and the at least one first circuit corresponds to at least one most significant bit in the bits B[1]-B[n]. In some embodiments, the capacitance value of the capacitor C in the at least one first circuit is set based on thermometer code, the capacitance value of the capacitor C in at least one second circuit of the switched-capacitor circuits 120[1]-120[n] is set based on binary code, and the at least one second circuit corresponds to at least one least significant bit in the bits B[1]-B[n]. It should be understood that, the most significant bit and the least significant bit are utilized for only illustrating and distinguishing the capacitance values of the capacitors C corresponding to various bits, and the present disclosure is not limited thereto.

For example, if n is 11, the capacitance values of the capacitors C in the switched-capacitor circuits 120[1]-120[n] can be set with reference to the following table:

| bit | B[11] | B[10] | B[9] | B[8] | B[7] | B[6] | B[5] | B[4] | B[3] | B[2] | B[1] |
|---|---|---|---|---|---|---|---|---|---|---|---|
| capacitance value | 128 | 64 | 64 | 64 | 64 | 32 | 32 | 16 | 8 | 4 | 2 |

In the above table, the bits B[7]-B[11] are most significant bits, and the bits B[1]-B[6] are least significant bits. Assumed that the amount of the capacitance being switched corresponds to the upper limit of the transient error (i.e., voltage disturbance, which may be, for example, the transient error ER in FIG. 3B) on the output signal VO1 that can be tolerated by a specific application is 128 unit capacitors, and thus the capacitance value of the capacitors C corresponding to high weight bits (e.g., the bits B[7]-B[10]) that are allowed to adjust the gain during the analog front-end device 100 outputs data are set to be lower than the capacitance value of 64 unit capacitors. The capacitance values of the capacitors C corresponding to low weight bits (i.e., least significant bits) is set based on binary code, in order to reduce the number of circuit components (e.g., switches).

For example, each of the capacitance values of the capacitors C respectively corresponding to the bits B[7]-B[101] can be set to be 64 unit capacitors, and the capacitance values of the capacitors C respectively corresponding to the bits B[1]-B[6] can be sequentially set to be 2 unit capacitors, 4 unit capacitors, . . . , and 32 unit capacitors, based on binary code. The switched-capacitor circuits 120[1]-120[10] corresponding to the bits B[1]-B[10] may be set to be fine tune circuits, which are allowed to adjust the gain of the analog front-end device 100 during the analog front-end device 100 outputs data (i.e., the digital output DO). As a result, it can prevent the transient errors on the output signal VO1 (and/or the output signal VO2) from being too high, in order to lower the impacts on the signal-to-noise ratio of the analog front-end device 100. For example, the switched-capacitor circuits 120[1]-120[10] may dynamically adjust the circuit configuration according to the current operating temperature during the analog front-end device 100 outputs data, in order to instantly adjust the gain of the analog front-end device 100. Moreover, in this example, the capacitance value of the capacitor C corresponding to the bit B[11] is set to be 128 unit capacitors. The switched-capacitor circuit 120[11] corresponding to the bit B[11] may be set to be a coarse tune circuit, which is configured to adjust the gain of the analog front-end device 100 before the analog front-end device 100 outputs data (i.e., the digital output DO), and is not allowed to adjust the gain during the analog front-end device 100 outputs the data. With such arrangements, the tunable range of the gain during the analog front-end outputs the data of the analog front-end device 100 can be further increased. It should be understood that, the value, the transient error(s), and the tunable range discussed in the above embodiments are given for illustrative purposes, and the present disclosure is not limited thereto.

Figure 2B:
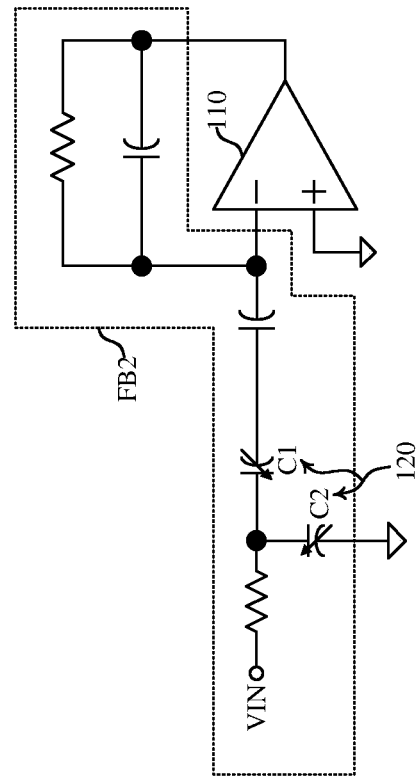
FIG. 2B shows a schematic diagram of the gain control circuit in FIG. 1A or FIG. 1B according to some embodiments of the present disclosure.

FIG. 2B shows a schematic diagram of the gain control circuit 120 in FIG. 1A or FIG. 1B according to some embodiments of the present disclosure. As mentioned above, the gain control circuit 120 may be an AC-coupling circuit, but the present disclosure is not limited thereto. In some other embodiments, the gain control circuit 120 may be at least part of a feedback network FB1 of the amplifier circuit 110, and the electronic component E1 may be a resistive component.

For example, as shown in FIG. 2B, the feedback network FB1 and the amplifier circuit 110 operate as a bandpass filter, in which the gain control circuit 120 may be employed to implement a resistor R in the feedback network FB1. In other words, the gain control circuit 120 may include switched-resistor circuits, which may provide an equivalent resistor to be the electronic component E1 (i.e., the resistor R) according to the bits B[1]-B[*n*]. In some other embodiments, the resistor R may include one or more resistive components that have an arrangement similar to that of capacitors C1-C2 in FIG. 2C.

Figure 2C:
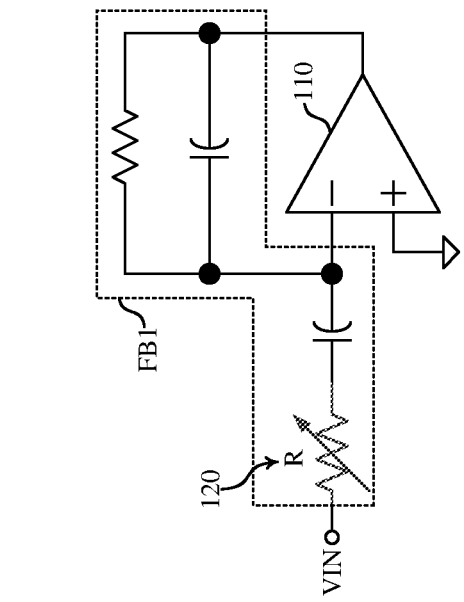
FIG. 2C shows a schematic diagram of the gain control circuit in FIG. 1A or FIG. 1B according to some embodiments of the present disclosure.

FIG. 2C shows a schematic diagram of the gain control circuit 120 in FIG. 1A or FIG. 1B according to some embodiments of the present disclosure. Similarly, in this example, the gain control circuit 120 may be at least one part of a feedback network FB2 of the amplifier circuit 110.

The feedback network FB2 and the amplifier circuit 110 operate as a bandpass filter, in which the gain control circuit 120 may be configured to implement a capacitor C1 and a capacitor C2 of the feedback network FB2. In other words, the gain control circuit 120 include switched-capacitor circuits, which may provide an equivalent capacitor to be the electronic component E1 (i.e., a combination of the capacitor C1 and the capacitor C2) according to the bits B[1]-B[*n*].

The above examples are given for illustrative purposes, and the present disclosure is not limited thereto. According to requirements of practical applications, the arrangements of the gain control circuit 120 can be adjusted correspondingly. For clear illustration, FIG. 2B shows examples applied in a single-end signal application, but the present disclosure is not limited thereto. In some embodiments, the arrangements of the gain control circuit 130 are identical to those of the gain control circuit 120, and thus the repetitious descriptions are not further given.

FIG. 3A shows a schematic diagram of the deglitch circuit 150 in FIG. 1A or FIG. 1B according to some embodiments of the present disclosure. The deglitch circuit 150 includes flip flop circuits 301-305 and a multiplexer circuit 306. The flip flop circuits 301-305 may be, but not limited to, D-type flip flops. The flip flop circuits 301-304 output the update signal U1 to be an update signal U2' according to the clock signal CK1, and output the update signal U2' to be the update signal U2 according to the clock signal CK1. In greater detail, the flip flop circuit 301 and the flip flop circuit 302 are cascade coupled, in order to output the update signal U1 to be the update signal U2' according to the clock signal CK1. As a result, glitches on the update signal U1 can be removed. The flip flop circuit 303 and the flip flop circuit 304 are cascade coupled, in order to output the update signal U2' to be the update signal U2 according to the clock signal CK1.

The multiplexer circuit 306 is configured to output the gain control signal PG2 or the gain control signal PG1 to be a gain control signal PG2' according to the update signal U2'. The flip flop circuit 305 may output the gain control signal PG2' to be the gain control signal PG2 according to the clock signal CK1. For example, if the update signal U2' has a logic value of 1, the multiplexer circuit 306 outputs the gain control signal PG1 to be the gain control signal PG2'. As a result, the flip flop circuit 305 may output the gain control signal PG2' to be the gain control signal PG2 according to the clock signal CK1, in order to update bits in the gain control signal PG3 (e.g., the bits B[1]-B[*n*] in FIG. 2A) according to the gain control signal PG1, in order to adjust the gain. Alternatively, if the update signal U2' has a logic value of 0, the multiplexer circuit 306 may output the previous the gain control signal PG2 to be the gain control signal PG2'. As a result, the bits in the gain control signal PG2 generated from the flip flop circuit 305 are kept being unchanged, in order to maintain the current gain.

The above arrangements of the deglitch circuit 150 are given for illustrative purposes, and the present disclosure is not limited thereto. In some embodiments, according to requirements of practical applications, the deglitch circuit 150 may include a level shifter (not shown in the figure), in order to adjust levels of one or more internal signals in the deglitch circuit 150.

Figure 3B:
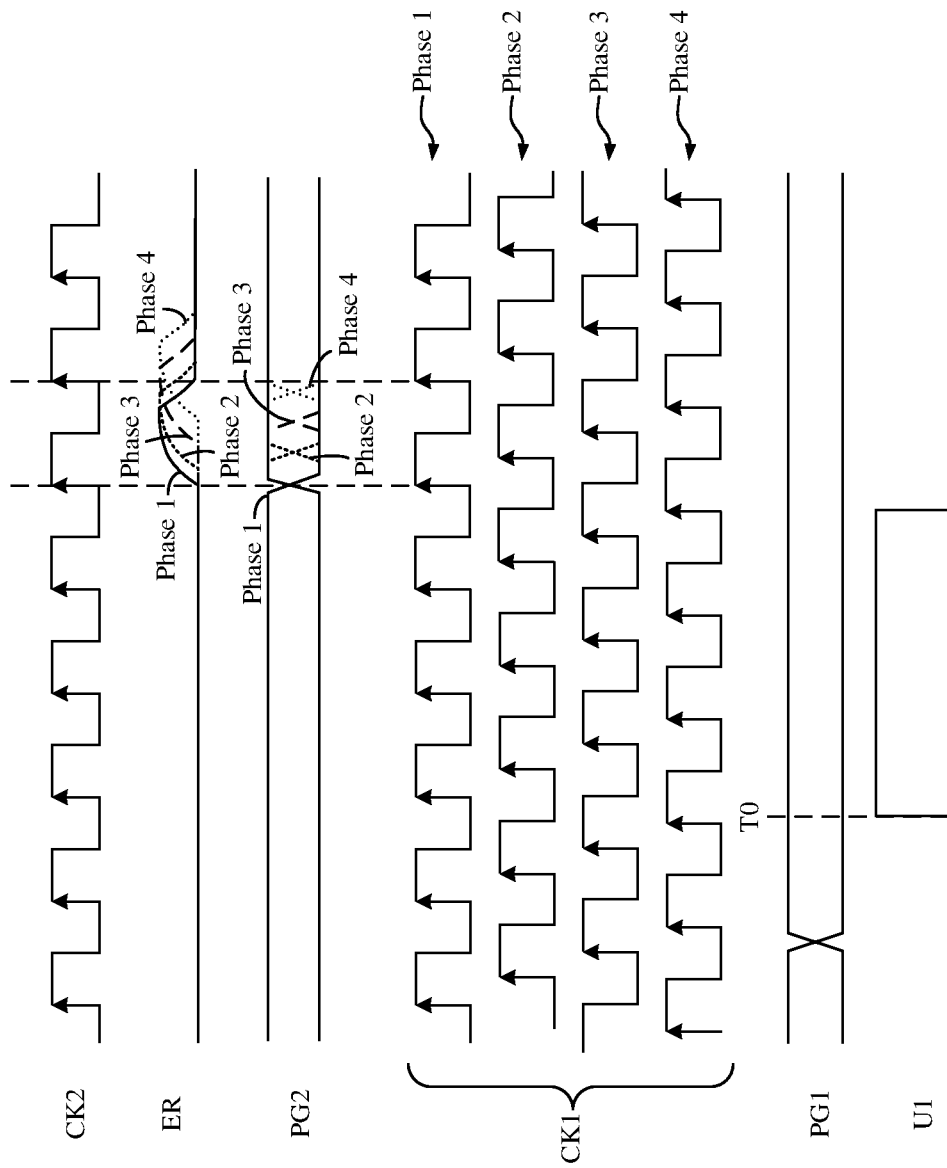
FIG. 3B shows a waveform diagram of signals in FIG. 1A or FIG. 1B according to some embodiments of the present disclosure.

FIG. 3B shows a waveform diagram of signals in FIG. 1A or FIG. 1B according to some embodiments of the present disclosure. When the update signal U1 has a predetermined level (e.g., a high level corresponding to the logic value of 1), the latch circuit 160 and the latch circuit 170 are triggered to output the gain control signal PG2 to be the gain control signal PG3 and the gain control signal PG4, in order to adjust the gain. In some embodiments, in order to adjust the gain, the gain control signal PG1 is switched (i.e., bits in gain control signal PG1 are switched to adjust the bits BR 1-B[*n*] of the gain control signal PG3 and those of the gain control signal PG4) before time T0, and the update signal U1 has the predetermined level after time T0. The multiplexer circuit 306 may output the updated gain control signal PG1 to be the gain control signal PG2' according to the update signal U2' (which is a delayed update signal U1). As a result, when the update signal U2 has the predetermined level, the latch circuit 160 and the latch circuit 170 are triggered to output the gain control signal PG2 to be the gain control signal PG3 and the gain control signal PG4. With such arrangement, the gain control circuit 120 and the gain control circuit 130 are assured to be switched at the same time, in order to reduce the transient errors on the differential output signals VO1 and VO2.

Furthermore, as mentioned above, a phase difference between the clock signal CK1 and the clock signal CK2 is set according to the transient error(s) (e.g., transient error ER in FIG. 3B) on the output signal VO1 (and/or the output signal VO2). For example, during a circuit design phase, the clock signal CK having different phases (e.g., phases 1-4 in FIG. 3B, in which two adjacent phases are different by about 90 degrees) is utilized to test the deglitch circuit 150. As shown in FIG. 3B, according to the clock signal CK1 having different phases, a timing for the gain control signal PG1 being outputted to be the gain control signal PG2 will be varied (which further results in a time variation of the gain control signals PG3 and PG4). As a result, a corresponding timing for the transient error ER occurring on the output signal VO1 (and/or the output signal VO2) will be varied as well. In order to prevent the analog to digital converter circuit 180 from sampling the transient error ER, the clock signal CK1 having a proper phase can be selected according to the test result. For example, the analog to digital converter circuit 180 samples the output signal VO1 and the output signal VO2 according to a rising edge of the clock signal CK2. The transient error ER corresponding the phase 1 does not overlap with the rising edge of the clock signal CK2. Accordingly, the clock signal CK1 having the phase 1 is selected to be the final clock signal CK1.

In the above examples, the final clock signal CK1 and the clock signal CK2 have the same phase (i.e., the phase difference therebetween is zero), but the present disclosures ins not limited thereto. According to different test results, the phase difference between the clock signal CK1 and the clock signal CK2 may be a predetermined value.

Figure 4A:
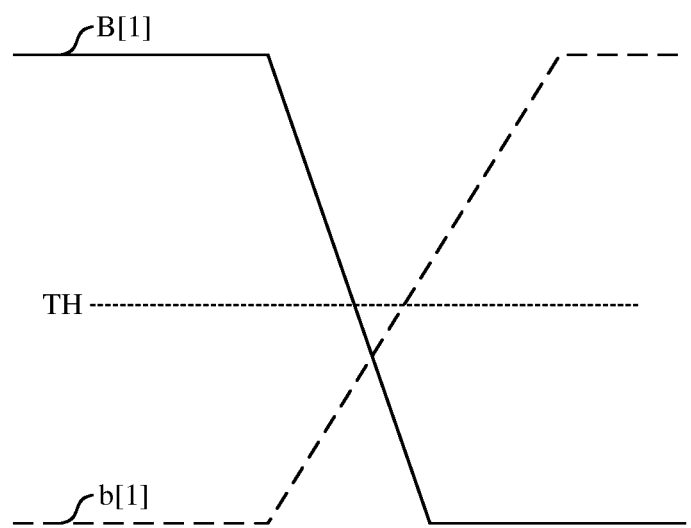
FIG. 4A shows a schematic diagram of partial waveforms of two bits in FIG. 2A according to some embodiments of the present disclosure.

FIG. 4A shows a schematic diagram of partial waveforms of the bit B[1] and the bit b[1] in FIG. 2A according to some embodiments of the present disclosure. As mentioned above, the interval of the switch SW1 being turned on is not overlapped with the interval of the switch SW2 being turned on. If each of the switch SW1 and the switch SW2 is implemented with a N-type transistor (which may be, but not limited to, MOSFET), the switch SW1 is turned on when the level of the bit B[1] is higher than a threshold voltage TH of the switch SW1, and the switch SW2 is turned on when the level of the bit b[1] is higher than the threshold voltage TH of the switch SW2. As shown in FIG. 4A, during the transition of the bit B[1] and the bit b[1], a crossing of a rising edge of one of the bits B[1] and b[1] and a falling edge of another one of the bits B[1] and b[1] is lower than the threshold voltage TH. With such arrangements, it can assure that the interval of the switch SW1 being turned on and the interval of the switch SW2 being turned on are not overlapped with each other to reduce the voltage disturbance occurring on the capacitors C during the switching, in order to reduce the redistribution of changes between the capacitors C. As a result, the transient error(s) on the output signal VO1 and the output signal VO2 can be reduced.

Figure 4B:
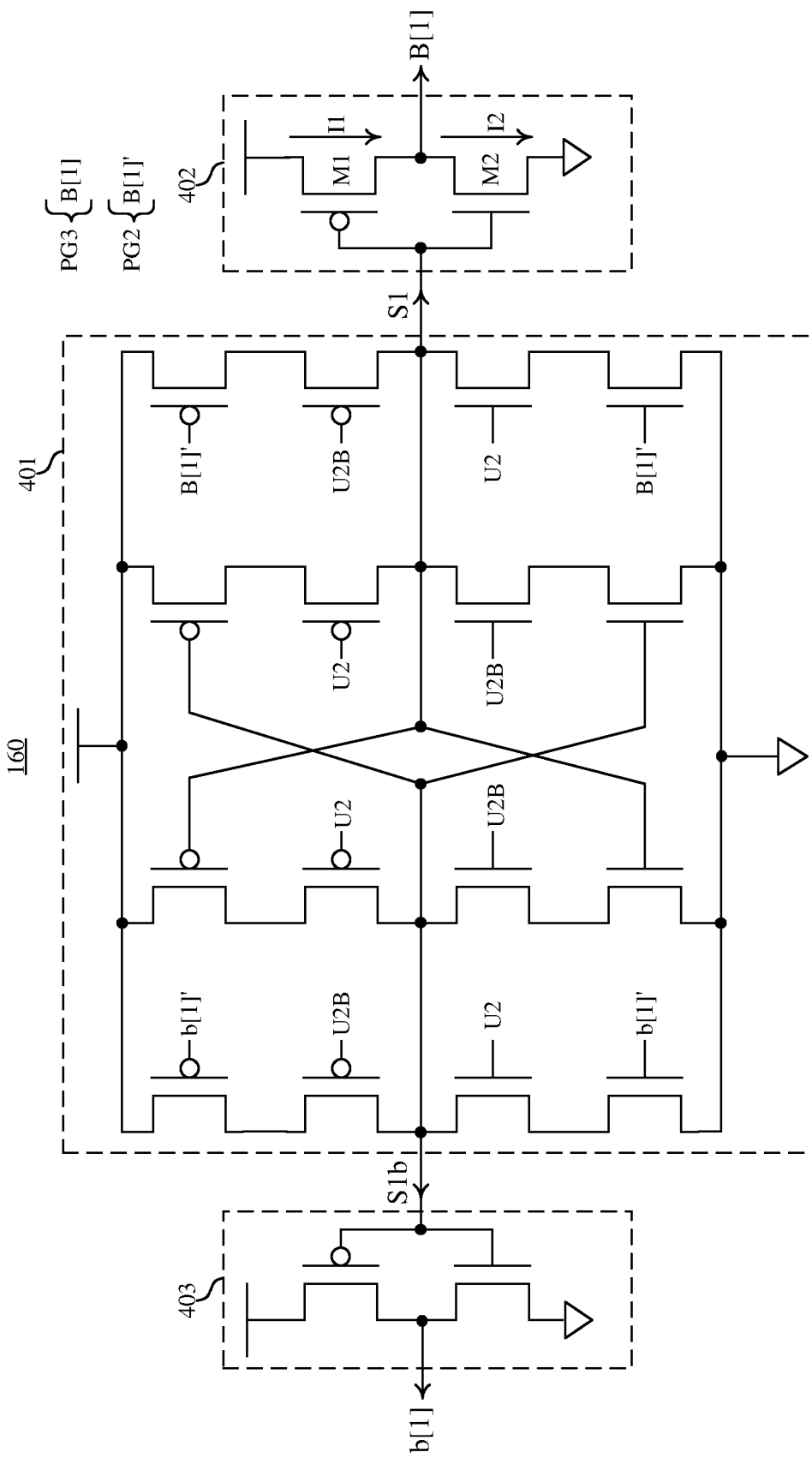
FIG. 4B shows a schematic diagram of the latch circuit in FIG. 1A or FIG. 1B according to some embodiments of the present disclosure.

FIG. 4B shows a schematic diagram of the latch circuit 160 in FIG. 1A or FIG. 1B according to some embodiments of the present disclosure. The latch circuit 160 includes a positive feedback circuit 401 and output stage circuits 402-403. For ease of understanding, FIG. 4B only shows a circuit portion that process a bit in the gain control signal PG2 (e.g., bit B[1]', which corresponds to the Bit B[1] in the gain control signal PG3).

The positive feedback circuit 401 is configured to be triggered according to the update signal U2, in order to generate a signal S1 and a signal S1b according to the bit B[1]' and a corresponding bit b[1]' (which has a logic value opposite to the bit B[1]'). For example, when the positive feedback circuit 401 is triggered according to the update signal U2 and an update signal U2B (which has a logic value opposite to the update signal U2), the positive feedback circuit 401 may quickly adjust the level of the signal S1 to be a first predetermined level (e.g., a system high voltage or a system low voltage) and transmit the signal S1 to the output stage circuit 402. Similarly, when the positive feedback circuit 401 is triggered according to the update signal U2 and the update signal U2B, the positive feedback circuit 401 may quickly adjust the level of the signal S1b to a second predetermined level (which is opposite to the first predetermined level) and transmit the signal S1b to the output stage circuit 403. The output stage circuits 402-403 may output the signal S1 and the signal S1b to be the bit B[1] and the bit b[1], respectively.

In some embodiments, a pull-up current of each of the output stage circuits 402-403 is not equal to a pull-down current of each of the output stage circuits 402-403. Taking the output stage circuit 402 as an example, the output stage circuit 402 includes a pull-up transistor M1 and a pull-down transistor M2. An aspect ratio of the pull-up transistor M1 may be set to be smaller than that of the pull-down transistor M2. As a result, the pull-up current I1 of the pull-up transistor M1 may be lower than the pull-down current I2 of the pull-down transistor M2, in order to form the waveform having low crossing shown in FIG. 4A. The arrangements of the output stage circuit 403 are the same as those of the output stage circuit 402, and thus the repetitious descriptions are not further given.

The above arrangements of the latch circuit 160 are given for illustrative purposes, and the present disclosure is not limited thereto. Various types of the latch circuit 160 able to transmit data (e.g., transmit the bit B[1]' to be the bit B[1]) according to the update signal U2 are within the contemplated scope of the present disclosure. It should be understood that, in FIG. 2A, if the switch SW1 and the switch SW2 are implemented with P-type transistors, the crossing between the rising edge of one of the bit B[1] and the bit b[1] and the falling edge of another one of the bit B[1] and the bit b[1] is higher than the threshold voltage TH of the corresponding switch during the transition of the bits B[1] and b[1]. Correspondingly, in FIG. 4B, the aspect ratio of the pull-up transistor M1 is set to be larger than that of the pull-down transistor M2. As a result, the pull-up current I1 of the pull-up transistor M1 is higher than the pull-down current I2 of the pull-down transistor M2, in order to generate the waveform having the high crossing. The arrangements of the latch circuit 170 is the same as those of the latch circuit 160, and thus the repetitious descriptions are not further given.

The above embodiments are given with differential circuit applications, but the present disclosure is not limited thereto. For example, the analog front-end device 100 can be applied with a single-end signal application, in which the terminal IP may directly receive a common mode voltage, and the gain control circuit 130 and the latch circuit 170 may be not employed.

It should be understood that the contemplated scope of the present disclosure is not limited to arrangements shown in each figure. In different embodiments, the analog front-end device 100 may employ at least one of the gain control circuit 120 (and/or the gain control circuit 130), the tracking circuit 140, the deglitch circuit 150, or the latch circuit 160 (and/or the latch circuit 170), in order to reduce transient error(s) on the output signal VO1 (and/or the output signal VO2). In some embodiments, if the analog front-end device 100 does not employ the deglitch circuit 150, the gain control signal PG1 may be directly inputted to the latch circuit 160 (and/or the latch circuit 170) (i.e., replace the gain control signal PG2). In some embodiments, if the analog front-end device 100 does not employ the deglitch circuit 150 and the latch circuit 160 (and/or the latch circuit 170), the gain control signal PG1 may be directly inputted to the gain control circuit 120 (and/or the gain control circuit 130) (i.e., replace the gain control signal PG3 and the gain control signal PG4).

As described above, the analog front-end device provided in some embodiments of the present disclosure may employ multiple circuit techniques to reduce impacts from transient errors on the output signal during the gain adjustment, in order to increase the signal to noise ration of the system. As a result, the gain can be adjusted during the analog front-end device outputs data, in order to instantly reduce impacts from temperature or other non-ideal factors.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:

1. An analog front-end device, comprising:
   an amplifier circuit configured to generate a first output signal according to a first input signal;
   a first gain control circuit configured to set a first electronic component according to a first gain control signal and transmit the first input signal to a first input terminal of the amplifier circuit via the first electronic component, wherein a terminal of the first electronic component is selectively coupled to the first input terminal or a first predetermined node; and
   a tracking circuit configured to adjust a level of the first predetermined node according to a level of the first input terminal, in order to reduce a voltage difference between the first input terminal and the first predetermined node and avoid a redistribution of charges on the first electronic component during a gain adjustment of the analog front-end device.

2. The analog front-end device of claim 1, wherein the first gain control circuit is an AC-coupling circuit.

3. The analog front-end device of claim 1, wherein the first gain control circuit comprises:
   a plurality of switched-capacitor circuits configured to be switched according to a plurality of bits in the first gain control signal, in order to provide an equivalent capacitor as the first electronic component,
   wherein each of the plurality of switched-capacitor circuits comprises a capacitor, a capacitance value of the capacitor of at least one first circuit in the plurality of switched-capacitor circuits is set according to a transient error on the first output signal, and the at least one first circuit corresponds to at least one most significant bit in the plurality of bits.

4. The analog front-end device of claim 3, wherein the capacitance value of the capacitor of the at least one first circuit is set based on thermometer code, a capacitance value of the capacitor of at least one second circuit in the plurality of switched-capacitor circuits is set according to binary code, and the at least one second circuit corresponds to a least significant bit in the plurality of bits.

5. The analog front-end device of claim 1, wherein the tracking circuit is a unity-gain buffer circuit, and the unity-gain buffer circuit is configured to set the level of the first predetermined node according to the level of the first input terminal.

6. The analog front-end device of claim 1, wherein the amplifier circuit is further configured to generate the first output signal and a second output signal according to the first input signal and a second input signal, and the analog front-end device further comprises:
   a second gain control circuit configured to set a second electronic component according to the first gain control signal and transmit the second input signal to a second input terminal of the amplifier circuit via the second electronic component,
   wherein a terminal of the second electronic component is selectively coupled to the second input terminal or a second predetermined node, and the tracking circuit is further configured to adjust a level of the second predetermined node according to a level of the second input terminal or according to the level of the first input terminal and the level of the second input terminal, in order to reduce a voltage difference between the second input terminal and the second predetermined node.

7. The analog front-end device of claim 6, wherein the tracking circuit comprises:
   a first unity-gain buffer circuit configured to set the level of the first predetermined node according to the level of the first input terminal; and
   a second unity-gain buffer circuit configured to set the level of the second predetermined node according to the level of the second input terminal.

8. The analog front-end device of claim 6, wherein the first input terminal and the second input terminal are differential input terminals.

9. The analog front-end device of claim 6, wherein the tracking circuit comprises:
   a sensing circuit configured to generate a first voltage according to the level of the first input terminal and the level of the second input terminal; and
   a unity-gain buffer circuit configured to set the level of the first predetermined node according to the first voltage, wherein the first predetermined node and the second predetermined node are coupled to each other.

10. The analog front-end device of claim 9, wherein the sensing circuit comprises:
    a first resistor, wherein a first terminal of the first resistor is coupled to the first input terminal, and a second terminal of the first resistor is configured to output the first voltage; and
    a second resistor, wherein a first terminal of the second resistor is coupled to the second terminal of the first resistor, and a second terminal of the second resistor is coupled to the second input terminal.

11. An analog front-end device, comprising:
    an amplifier circuit configured to generate a first output signal according to a first input signal;
    a first gain control circuit configured to set a first electronic component according to a first gain control signal and transmit the first input signal to a first input terminal of the amplifier circuit via the first electronic component, wherein a terminal of the first electronic component is selectively coupled to the first input terminal or a first predetermined node;

a tracking circuit configured to adjust a level of the first predetermined node according to a level of the first input terminal, in order to reduce a voltage difference between the first input terminal and the first predetermined node;

a deglitch circuit configured to remove a glitch on a first update signal according to a first clock signal to generate a second update signal, generate a second gain control signal according to the first update signal and the first gain control signal, and output the second update signal and the second gain control signal according to the first clock signal; and a latch circuit configured to output the second gain control signal to be a third gain control signal according to the second update signal, wherein the first gain control circuit is configured to set the first electronic component according to the third gain control signal.

12. The analog front-end device of claim 11, further comprising:

an analog to digital converter circuit configured to sample the first output signal according to a second clock signal, in order to generate a digital output, wherein a phase difference between the first clock signal and the second clock signal is determined based on a transient error on the first output signal.

13. The analog front-end device of claim 11, wherein the latch circuit comprises:

a positive feedback circuit configured to be triggered according to the second update signal to generate a first signal and a second signal according a second bit in the second gain control signal and a first bit, wherein the first bit and the second bit have opposite logic values, and a plurality of output stage circuits configured to output a third bit in the third gain control signal according to the first signal and output a fourth bit that is opposite to the third bit according to the second signal, wherein a pull-up current of each of the plurality of output stage circuits is not equal to a pull-down current of each of the plurality of output stage circuits, and the first gain control circuit is configured to set the first electronic component according to the third bit and the fourth bit.

14. The analog front-end device of claim 13, wherein a crossing between the third bit and the fourth bit is lower than or higher than a threshold voltage of a switch in the first gain control circuit.

15. The analog front-end device of claim 11, wherein the deglitch circuit comprises:

a plurality of first flip flop circuits configured to output the first update signal to be a third update signal according to the first clock signal, and output the third update signal to be the second update signal according to the first clock signal;

a multiplexer circuit configured to output the second gain control signal or the first gain control signal to be a fourth gain control signal according to the third update signal; and a second flip flop circuit configured to output the fourth gain control signal to be the second gain control signal according to the first clock signal.

16. The analog front-end device of claim 1, wherein the first gain control circuit comprises a plurality of switches, when a first switch in the plurality of switches is turned on, the terminal of the first electronic component is coupled to the first input terminal via the first switch, when a second switch in the plurality of switches is turned on, the terminal of the first electronic component is coupled to the first predetermined node via the second switch, and an interval of the first switch being turned on is not overlapped with an interval of the second switch being turned on.

17. An analog front-end device, comprising:

an amplifier circuit configured to generate a first output signal according to a first input signal;

a first gain control circuit configured to set a first electronic component according to a first gain control signal and transmit the first input signal to a first input terminal of the amplifier circuit via the first electronic component, wherein a terminal of the first electronic component is selectively coupled to the first input terminal or a first predetermined node; and a tracking circuit configured to adjust a level of the first predetermined node according to a level of the first input terminal, in order to reduce a voltage difference between the first input terminal and the first predetermined node, wherein the first predetermined node is an AC ground.

18. The analog front-end device of claim 1, wherein the first gain control circuit is a feedback network.

19. The analog front-end device of claim 18, wherein the feedback network and the amplifier circuit operate as a filter circuit.

20. The analog front-end device of claim 1, wherein the first electronic component is a capacitive component or a resistive component.

* * * * *